US010476383B2

(12) United States Patent
Di Gilio

(10) Patent No.: US 10,476,383 B2
(45) Date of Patent: Nov. 12, 2019

(54) NEGATIVE CHARGE PUMP CIRCUIT

(71) Applicant: STMicroelectronics SA, Montrouge (FR)

(72) Inventor: Thierry Di Gilio, Allevard (FR)

(73) Assignee: STMicroelectronics SA, Montrouge (FR)

( * ) Notice: Subject to any disclaimer, the term of this patent is extended or adjusted under 35 U.S.C. 154(b) by 19 days.

(21) Appl. No.: 16/012,410

(22) Filed: Jun. 19, 2018

(65) Prior Publication Data

US 2018/0375428 A1    Dec. 27, 2018

(30) Foreign Application Priority Data

Jun. 23, 2017    (FR) ...................................... 17 55764

(51) Int. Cl.
| | | |
|---|---|---|
| *H02M 3/07* | (2006.01) | |
| *H02M 1/36* | (2007.01) | |
| *H03K 17/30* | (2006.01) | |
| *H02M 1/14* | (2006.01) | |
| *H02M 1/00* | (2006.01) | |

(52) U.S. Cl.
CPC ............... *H02M 3/07* (2013.01); *H02M 1/14* (2013.01); *H02M 1/36* (2013.01); *H03K 17/302* (2013.01); *H02M 2001/009* (2013.01); *H02M 2003/071* (2013.01); *H02M 2003/072* (2013.01)

(58) Field of Classification Search
CPC .. G05F 3/00; G05F 3/205; G11C 5/00; G11C 5/145; H02M 1/00; H02M 1/36; H02M 2001/00; H02M 2001/009; H02M 2003/00; H02M 2003/071; H02M 2003/072; H02M 2003/077; H02M 3/00; H02M 3/07; H02M 3/073; H03K 17/00; H03K 17/302
USPC .......................................................... 327/536
See application file for complete search history.

(56) References Cited

U.S. PATENT DOCUMENTS

| | | | | |
|---|---|---|---|---|
| 5,900,665 A | * | 5/1999 | Tobita .................. | H01L 27/108 257/339 |
| 2007/0132435 A1 | * | 6/2007 | Hasegawa .............. | H02M 1/36 323/222 |
| 2008/0088179 A1 | * | 4/2008 | Oyama .................. | H02M 3/07 307/28 |

(Continued)

FOREIGN PATENT DOCUMENTS

| | | |
|---|---|---|
| EP | 2 975 750 A1 | 1/2016 |
| JP | 2010-17013 A | 1/2010 |

*Primary Examiner* — Lincoln D Donovan
*Assistant Examiner* — Dave Mattison
(74) *Attorney, Agent, or Firm* — Seed IP Law Group LLP

(57) ABSTRACT

The disclosure relates to a negative charge pump circuit including a first capacitor; a first selector switch; a second selector switch; and a control circuit designed to, in a first phase of operation, alternately control the first and second selector switches in a first configuration in which the first and second electrodes of the first capacitor are respectively linked to the first and second nodes and in a second configuration in which the first and second electrodes of the first capacitor are respectively linked to the second and third nodes. In a second phase of operation, the control circuit forces the first selector switch to link the first electrode of the first capacitor to the second node and control the second selector switch so as to alternately link the second electrode of the first capacitor to the second and to the third node.

17 Claims, 2 Drawing Sheets

(56) References Cited

U.S. PATENT DOCUMENTS

2008/0122941 A1    5/2008  Kikuchi et al.
2016/0036320 A1*   2/2016  Crandall ................. H02M 3/07
                                                      455/77

* cited by examiner

NEGATIVE CHARGE PUMP CIRCUIT

BACKGROUND

Technical Field

The present application relates to a negative charge pump circuit, notably a negative charge pump circuit designed to be connected to a capacitive load.

Description of the Related Art

Numerous electronic devices, for example integrated circuits, are supplied by a source of electrical power delivering a voltage of fixed polarity, here called positive polarity. However, in certain cases, in addition to the positive voltage delivered by the power source, it is desired to have a voltage of opposite polarity available, here called negative polarity.

In order to generate a negative voltage starting from a positive power supply voltage, a negative charge pump circuit is commonly used, also known as an inverting charge pump circuit.

It would be desirable to be able to improve, at least in part, certain aspects of known negative charge pump circuits.

SUMMARY

One embodiment provides a negative charge pump circuit including a first capacitor, a first selector switch linking a first electrode of the first capacitor either to a first node for applying a positive power supply potential or to a second node for applying a reference potential, and a second selector switch linking a second electrode of the first capacitor either to the second node or to a third node for supplying a negative power supply potential. A control circuit is designed to, in a first phase of operation, alternately control the first and second selector switches in a first configuration, in which the first and second electrodes of the first capacitor are respectively linked to the first and second nodes, and in a second configuration the first and second electrodes of the first capacitor are respectively linked to the second and third nodes. In a second phase of operation, the control circuit forces the first selector switch to link the first electrode of the first capacitor to the second node and control the second selector switch so as to alternately link the second electrode of the first capacitor to the second and to the third node.

According to one embodiment, the control circuit is designed to alternately repeat the first and second phases of operation in a periodic fashion, in such a manner that the potential of the third node is established at a negative value in the range between the reference potential and the opposite of the positive power supply potential.

According to one embodiment, the negative charge pump circuit furthermore includes a second capacitor, a third selector switch linking a first electrode of the second capacitor either to the first node or to the second node, and a fourth selector switch linking a second electrode of the second capacitor either to the second node or to the third node. The control circuit is designed to, in the first phase of operation, control the third and fourth selector switches in phase opposition with the first and second selector switches so as to link the first and second electrodes of the second capacitor respectively to the second and third nodes when the first and second electrodes of the first capacitor are respectively linked to the first and second nodes, and to link the first and second electrodes of the second capacitor respectively to the first and second nodes when the first and second electrodes of the first capacitor are respectively linked to the second and third nodes. In the second phase of operation, the control circuit forces the third selector switch to link the first electrode of the second capacitor to the second node and control the fourth selector switch in phase opposition with the second selector switch so as to alternately link the second electrode of the second capacitor to the third node, when the second electrode of the first capacitor is linked to the second node, and to the second node when the second electrode of the first capacitor is linked to the third node.

According to one embodiment, each selector switch comprises a first P-channel MOS transistor in series with a second N-channel MOS transistor, the drains of the first and second transistors being common and the gates of the first and second transistors being common, the source of the first transistor defining a first conduction node of the selector switch, the source of the second transistor defining a second conduction node of the selector switch, the drains of the first and second transistors defining a third conduction node of the selector switch, and the gates of the first and second transistors defining a control node of the selector switch.

According to one embodiment, the control circuit comprises a node for applying a clock signal and a node for applying an operating mode selection signal, the clock signal defining the switching frequency for the first and second selector switches in the first phase of operation and the switching frequency for the second selector switch in the second phase of operation, and the operating mode selection signal defining the duration of the first and second phases of operation.

According to one embodiment, the control circuit comprises a first operating mode selection circuit designed to apply a control signal to the first selector switch that is substantially identical to the clock signal when the operating mode selection signal is in a first state and a fixed control signal forcing the first selector switch to link the first electrode of the first capacitor to the second node when the operating mode selection signal is in a second state.

According to one embodiment, the control circuit is designed to apply a control signal to the second selector switch that is substantially identical to the clock signal but shifted in voltage by a value substantially equal to the opposite of the positive power supply potential, irrespective of the state of the operating mode selection signal.

According to one embodiment, the control circuit comprises a second operating mode selection circuit designed to apply a control signal to the third selector switch complementary to the clock signal when the operating mode selection signal is in the first state and a fixed control signal forcing the third selector switch to link the first electrode of the second capacitor to the second node when the operating mode selection signal is in the second state.

According to one embodiment, the control circuit is designed to apply a control signal to the fourth selector switch that is substantially identical to the complementary clock signal but shifted in voltage by a value substantially equal to the opposite of the positive power supply potential, irrespective of the state of the operating mode selection signal.

One embodiment provides a method for controlling a negative charge pump circuit including a first capacitor; a first selector switch linking a first electrode of the first capacitor either to a first node for applying a positive power supply potential or to a second node for applying a reference potential and a second selector switch linking a second electrode of the first capacitor either to the second node or to a third node for supplying a negative power supply potential. The method includes, in a first phase of operation, alternately controlling the first and second selector switches in a first configuration in which the first and second electrodes of the first capacitor are respectively linked to the first and second nodes and in a second configuration in which the first and second electrodes of the first capacitor are respectively linked to the second and third (Vneg) nodes, and, in a second phase of operation, forcing the first selector switch to link the first electrode of the first capacitor to the second node and controlling the second selector switch so as to alternately link the second electrode of the first capacitor to the second and to the third node.

BRIEF DESCRIPTION OF THE SEVERAL VIEWS OF THE DRAWINGS

These features and advantages, together with others, will be presented in detail in the following description of particular, but non-limiting, embodiments in relation with the appended figures amongst which.

DETAILED DESCRIPTION

The same elements have been denoted by the same references in the various figures. For the sake of clarity, only the elements useful to the understanding of the embodiments described have been shown and are detailed. In particular, the various uses which may be made of the negative charge pump circuits described have not been detailed, the embodiments described being compatible with all or the majority of the known applications of a negative charge pump circuit. In the present description, the term "connected" will be used to denote a direct electrical link, with no intermediate electronic components, for example by means of a conductive track, and the term "coupled" or the term "linked" to denote either a direct electrical link (then meaning "connected") or a link via one or more intermediate components (resistor, capacitor, etc.). Unless otherwise stated, the expressions "approximately", "substantially", and "of the order of" mean to the nearest 10%, or preferably to the nearest 5%.

Figure 1:
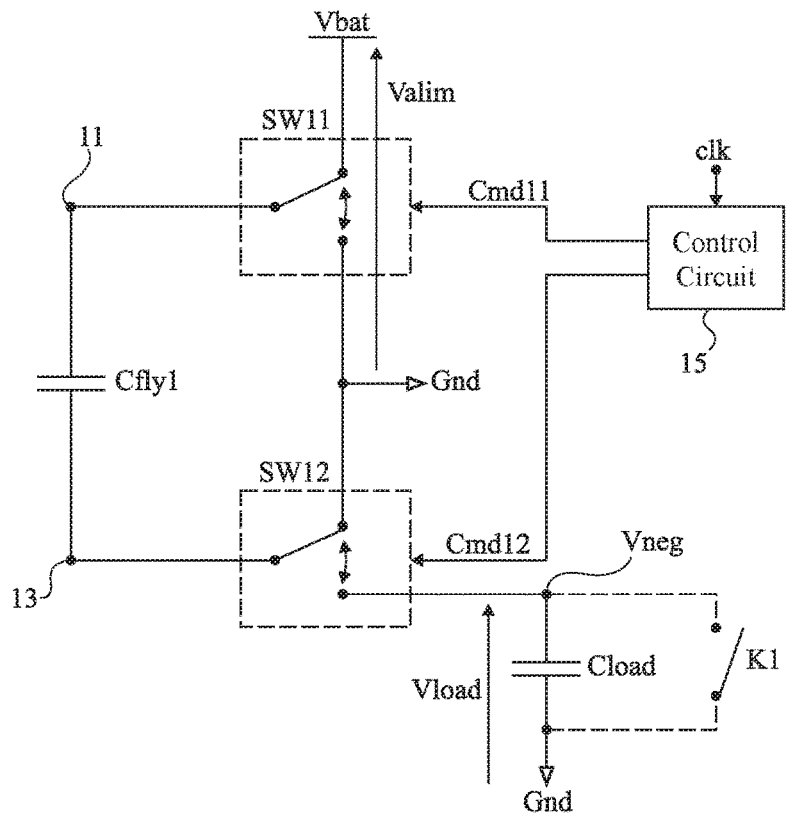
FIG. 1 is a simplified electrical circuit diagram of one example of a negative charge pump circuit according to one embodiment of the present disclosure.

FIG. 1 is a simplified electrical circuit diagram of one example of a negative charge pump circuit.

The circuit in FIG. 1 is designed to generate a negative voltage Vload starting from a positive power supply voltage Valim, for example a DC voltage, supplied by an electrical power supply source (not shown). The voltage Valim is applied between a node Vbat and a node Gnd of the circuit, and the voltage Vload is delivered between a node Vneg of the circuit and the node Gnd. In operation, the node Gnd is at a reference potential of the circuit, considered as fixed, for example equal to 0 V. By way of example, the node Gnd is connected to the ground of the circuit. For its part, the node Vbat receives a positive power supply potential, in other words higher than the potential of the node Gnd, and the node Vneg supplies a negative power supply potential, in other words lower than the potential of the node Gnd. In FIG. 1, a capacitor of capacitance Cload has furthermore been shown connected between the nodes Vneg and Gnd, schematically representing the capacitance of the load intended to receive the negative power supply voltage Vload.

The circuit in FIG. 1 includes a capacitor Cfly1, a first selector switch SW11 designed to link a first electrode 11 of the capacitor Clfy1 either to the node Vbat or to the node Gnd, and a second selector switch SW12 designed to link a second electrode 13 of the capacitor Cfly1 either to the node Gnd or to the node Vneg. The circuit in FIG. 1 furthermore includes a control circuit 15 designed to control the selector switches SW11 and SW12. More particularly, in this example, the control circuit 15 receives a clock signal clk and supplies a control signal Cmd11 to the selector switch SW11 and a control signal Cmd12 to the selector switch SW12.

In the example in FIG. 1, the circuit 15 alternately controls the selector switches SW11 and SW12, at the frequency of the clock signal clk, in a first configuration, in which the selector switch SW11 links the first electrode 11 of the capacitor Cfly1 to the node Vbat and the selector switch SW12 links the second electrode 13 of the capacitor Cfly1 to the node Gnd, and in a second configuration in which the selector switch SW11 links the first electrode 11 of the capacitor Cfly1 to the node Gnd and the selector switch SW12 links the second electrode 13 of the capacitor Cfly1 to the node Vneg.

In the first configuration (capacitor Cfly1 connected between the nodes Vbat and Gnd), the capacitor Cfly1 tends to charge up to a positive voltage. In the second configuration (capacitor Cfly1 connected between the nodes Gnd and Vneg), owing to the connection of the positive electrode 11 of the capacitor Clfy1 to the node Gnd, the capacitor Cfly1 tends to impose a negative voltage Vload between the nodes Vneg and Gnd.

After a certain number of cycles of the clock signal clk, depending notably on the values of the capacitances Cfly1 and Cload, on the frequency of the clock signal clk, and on the duty cycle of the switching operations (in other words on the ratio between the control period of the selector switches SW11 and SW12 in the first configuration and the control period of the selector switches SW11 and SW12 in the second configuration within the same period of the clock signal clk), the voltage Vload stabilizes at a negative value substantially equal to −Valim (i.e., at a magnitude that is substantially equal to the magnitude of positive power supply voltage Valim).

One limitation of this mode of operation is that the value of the negative voltage Vload delivered, in the steady state, by the charge pump circuit, cannot be adjusted.

In some applications, it would however be desirable to be able to adjust the value of the negative voltage Vload supplied by a charge pump circuit, for example between 0 V and −Valim.

In particular, in certain integrated circuits fabricated within a structure of the SOI ("Semiconductor-On-Insulator") type and, more particularly, the FDSOI (Fully-Depleted SOI) type, it is desired to be able to apply a negative voltage of adjustable value to the semiconductor substrate of the structure, so as to control the threshold voltage of MOS transistors formed in and on the structure.

In order to adjust the value of the negative voltage Vload applied to the load Cload, one possibility is to provide a switch K1, for example a MOS transistor, connected in parallel with the load Cload, in other words between the nodes Vneg and Gnd (link shown with the dashed lines in FIG. 1). When the transistor K1 is conducting, the capacitor Cload is discharged, which tends to make the potential of the node Vneg rise. By suitably choosing the periodicity with which the switch K1 is set to the conducting state and the period of time during which the switch K1 remains in the conducting state, it is possible to balance the effect of the switch K1 (discharging of Cload) and that of the selector switches SW11 and SW12 (charging of Cload) on the voltage Vload. Thus, in the steady state, the value of the voltage Vload may be kept substantially constant, at a value chosen between 0 V and −Valim. One drawback of this solution is that, given that the switch K1 is connected between the nodes Gnd and Vneg, it is necessary to generate a negative control signal for controlling the conducting or non-conducting state of the switch. Moreover, in order to be able to quickly discharge the capacitor Cload, and hence quickly adjust the level of the negative voltage Vload, the switch K1 must have relatively large dimensions.

Figure 2:
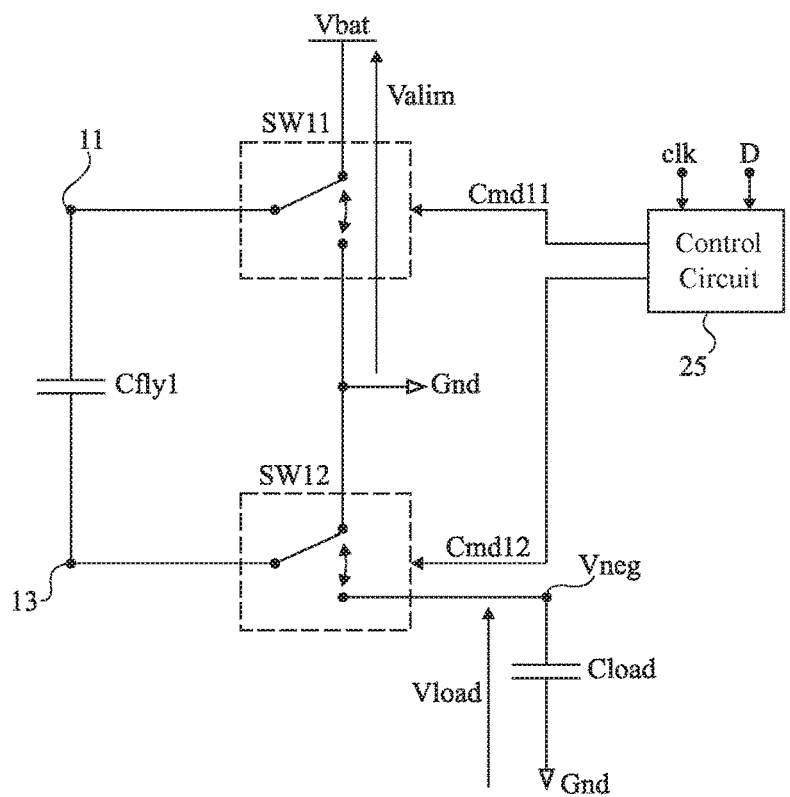
FIG. 2 is a simplified electrical circuit diagram of one exemplary embodiment of a negative charge pump circuit according to another embodiment of the present disclosure.

FIG. 2 is a simplified electrical circuit diagram of one exemplary embodiment of a negative charge pump circuit. The circuit in FIG. 2 differs from the circuit in FIG. 1 essentially in that it does not comprise the switch K1 of the circuit in FIG. 1, and in that the control circuit 15 of the circuit in FIG. 1 is replaced by a control circuit 25.

As in the example in FIG. 1, the control circuit 25 receives a clock signal clk and supplies a control signal Cmd11 to the selector switch SW11 and a control signal Cmd12 to the selector switch SW12. In the example in FIG. 2, the control circuit 25 furthermore receives an additional control signal D, for example a binary signal.

The charge pump circuit in FIG. 2 has two separate modes of operation: a mode referred to as charging mode, and a mode referred to as discharging mode, selectively activatable via the signal D.

When the signal D is in a first state, for example a low state, for example at a potential substantially equal to the potential of the reference node Gnd of the circuit, the operation of the circuit in FIG. 2 is identical or similar to that of the circuit in FIG. 1, in other words the circuit 25 alternately controls the selector switches SW11 and SW12, at the frequency of the clock signal clk, in a first configuration in which the selector switch SW11 links the first electrode 11 of the capacitor Cfly1 to the node Vbat and the selector switch SW12 links the second electrode 13 of the capacitor Cfly1 to the node Gnd, and in a second configuration in which the selector switch SW11 links the first electrode 11 of the capacitor Cfly1 to the node Gnd and the selector switch SW12 links the second electrode 13 of the capacitor Cfly1 to the node Vneg. The capacitor Cload then tends to charge up to a voltage Vload substantially equal to −Valim. The circuit is said to be operating in charging mode.

When the signal D is in a second state, for example a high state, for example at a potential substantially equal to the potential of the high power supply node Vbat of the circuit, the control circuit 25 forces the selector switch SW11 to link the electrode 11 of the capacitor Cfly1 to the node Gnd, and while the electrode 11 of the capacitor Cfly1 is kept linked to the node Gnd, alternately controls the selector switch SW12, at the frequency of the clock signal clk, in a first configuration in which the selector switch SW12 links the second electrode 13 of the capacitor Cfly1 to the node Vneg and in a second configuration in which the selector switch SW12 links the second electrode 13 of the capacitor Cfly1 to the node Gnd. The capacitor Cload then tends to discharge and the negative voltage Vload decreases (in absolute value), potentially until it reaches substantially zero. The circuit is said to operate in discharging mode.

By way of example, the signal D is a periodic signal with a period greater than the period of the signal clk, for example with a period equal to a multiple of the period of the signal clk. Thus, the charge pump circuit in FIG. 2 is alternately controlled in the charging mode and discharging mode.

By suitably choosing the period of the signal D and the duty cycle of the signal D (in other words the ratio between the duration of the charging phase and the duration of the discharging phase during one period of the signal D), it is possible to balance the effect of the charging and of the discharging of the capacitor Cload on the voltage Vload. Thus, in the steady state, the value of the voltage Vload may be kept substantially constant, at a value chosen between 0 V and −Valim.

One advantage of the charge pump circuit in FIG. 2 is that it allows the value of the negative voltage Vload applied to the load Cload to be adjusted (by adjusting the period and duty cycle of the signal D) without the need for an additional switch connected to the terminals of the load Cload as in the example in FIG. 1.

Figure 3:
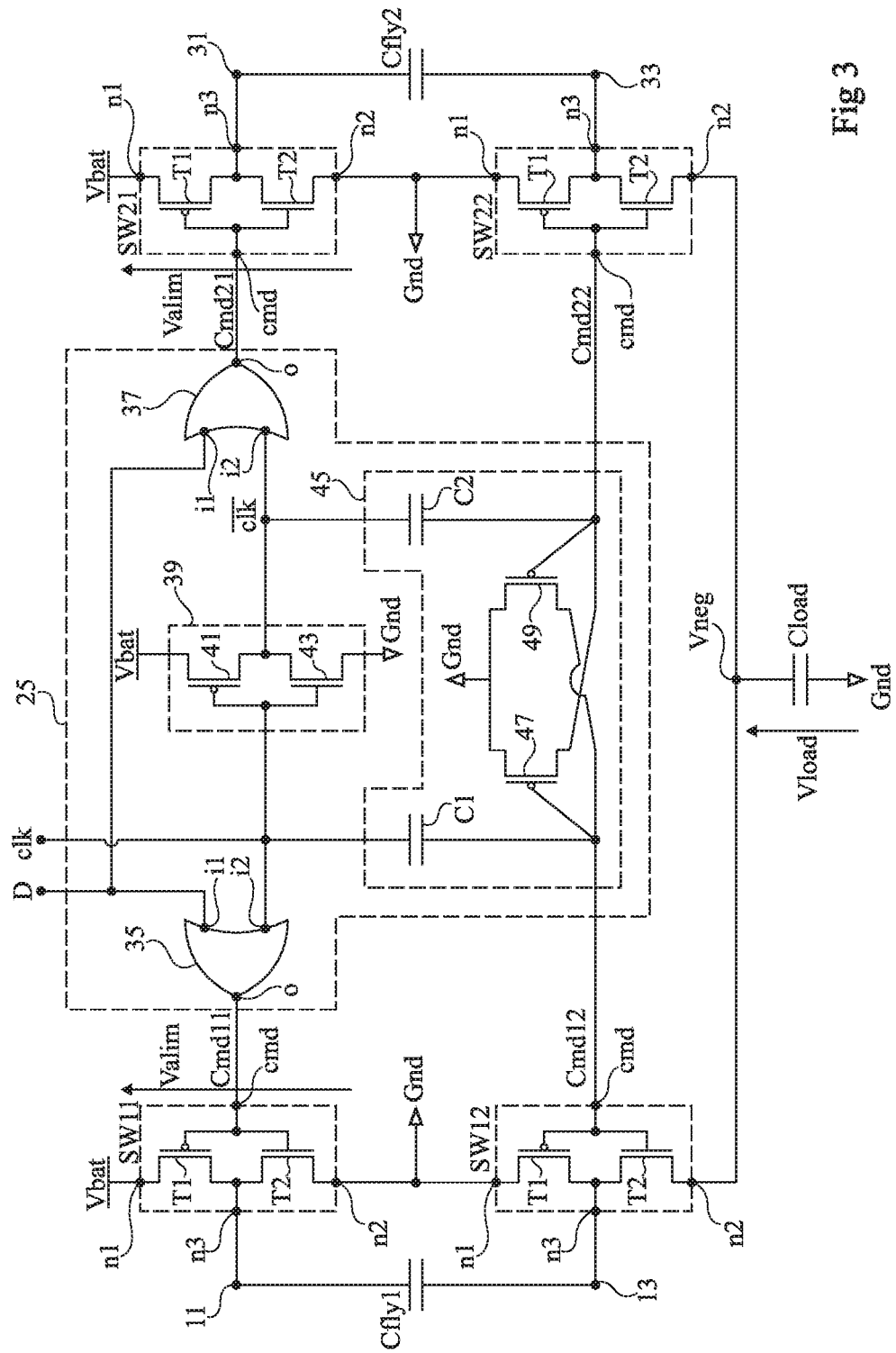
FIG. 3 is a more detailed electrical circuit diagram of another exemplary embodiment of a negative charge pump circuit according to yet another embodiment of the present disclosure.

FIG. 3 is a more detailed electrical circuit diagram of another exemplary embodiment of a negative charge pump circuit. The circuit in FIG. 3 includes the same elements as the circuit in FIG. 2, arranged substantially in the same manner, but shows in a more detailed manner one exemplary embodiment of the selector switches SW11 and SW12 and of the control circuit 25. In addition, in the example in FIG. 3, the charge pump circuit includes a second capacitor Cfly2, a third selector switch SW21 designed to link a first electrode 31 of the capacitor Clfy2 either to the node Vbat or to the node Gnd, and a fourth selector switch SW22 designed to link a second electrode 33 of the capacitor Cfly2 either to the node Gnd or to the node Vneg.

In the example in FIG. 3, the control circuit 25 supplies not only the control signals Cmd11 and Cmd12 for the selector switches SW11 and SW12, but also a control signal Cmd21 for the selector switch SW21 and a control signal Cmd22 for the selector switch SW22.

More particularly, in the example in FIG. 3, the control circuit 25 is configured for, in the charging mode (signal D in the low state), controlling the selector switch SW21 in phase opposition with the selector switch SW11 and controlling the selector switch SW22 in phase opposition with the selector switch SW12, and, in the discharging mode (signal D in the high state), forcing the selector switch SW21 to link the electrode 31 of the capacitor Cfly2 to the node Gnd and controlling the selector switch SW22 in phase opposition with the selector switch SW12.

Thus, in the charging mode, the circuit 25 controls the selector switches SW11, SW12, SW21 and SW22 at the frequency of the clock signal clk, alternately:

in a first configuration in which the selector switch SW11 links the electrode 11 of the capacitor Cfly1 to the node Vbat, the selector switch SW12 links the electrode 13 of the capacitor Cfly1 to the node Gnd, the selector switch SW21 links the electrode 31 of the capacitor Cfly2 to the node Gnd, and the selector switch SW22 links the electrode 33 of the capacitor Cfly2 to the node Vneg; and in a second configuration in which the selector switch SW11 links the electrode 11 of the capacitor Cfly1 to the node Gnd, the selector switch SW12 links the electrode 13 of the capacitor Cfly1 to the node Vneg, the selector switch SW21 links the electrode 31 of the capacitor Cfly2 to the node Vbat, and the selector switch SW22 links the electrode 33 of the capacitor Cfly2 to the node Gnd.

In the discharging mode, the circuit 25 forces the selector switch SW11 to link the electrode 11 of the capacitor Cfly1 to the node Gnd and forces the selector switch SW21 to link the electrode 31 of the capacitor Cfly2 to the node Gnd, and, while the electrode 11 of the capacitor Cfly1 and the electrode 31 of the capacitor Cfly2 are linked to the node Gnd, alternately controls the selector switches SW12 and SW22, at the frequency of the clock signal clk, in a first configuration in which the selector switch SW12 links the electrode 13 of the capacitor Cfly1 to the node Vneg and the selector switch SW22 links the electrode 33 of the capacitor Cfly2 to the node Gnd, and in a second configuration in which the selector switch SW12 links the electrode 13 of the capacitor Cfly1 to the node Gnd and the selector switch SW22 links the electrode 33 of the capacitor Cfly2 to the node Vneg.

Compared with the architecture in FIG. 2, one advantage of the architecture in FIG. 3 is that, in the charging mode (signal D in the low state), because of the operation in phase opposition of the selector switches SW11 and SW21 on the one hand, and SW12 and SW22 on the other, irrespective of the state of the clock signal clk, one of the two capacitors Cfly1 and Cfly2 tends to impose a negative voltage Vload between the nodes Vneg and Gnd. Moreover, in the discharging mode (signal D in the high state), because of the operation in phase opposition of the selector switches SW12 and SW22, irrespective of the state of the clock signal clk, the capacitor Cload tends to discharge. The result of this is that the charging and the discharging of the capacitor Cload may be carried out faster than in an architecture of the type described in relation to FIG. 2. In addition, in the steady state, this allows the unwanted oscillations of the voltage Vload around the setpoint value to be limited.

In the example in FIG. 3, each of the selector switches SW11, SW12, SW21 and SW22 includes a P-channel MOS transistor T1 linked in series with an N-channel MOS transistor T2 between first and second conduction nodes n1 and n2 of the selector switch. More particularly, in this example, the transistor T1 has its source connected to the node n1 and its drain connected to the drain of the transistor T2, and the transistor T2 has its source connected to the node n2. The drains of the transistors T1 and T2 are connected to a third conduction node n3 of the selector switch, and the gates of the transistors T1 and T2 are connected to a control node cmd of the selector switch. The operation of the selector switches SW11, SW12, SW21 and SW22 is as follows. When a control voltage of low level is applied to the control node cmd of the selector switch, the transistor T1 is conducting and the transistor T2 is turned off, such that the selector switch links its conduction node n3 to its conduction node n1. When a control voltage of high level is applied to the control node cmd of the selector switch, the transistor T1 is turned off and the transistor T2 is conducting, such that the selector switch links its conduction node n3 to its conduction node n2.

In the example in FIG. 3, the selector switches SW11 and SW21 have their nodes n1 connected to the node Vbat and their nodes n2 connected to the node Gnd, the selector switches SW12 and SW22 have their nodes n1 connected to the node Gnd and their nodes n2 connected to the node Vneg, the selector switches SW11, SW12, SW21 and SW22 have their nodes n3 respectively connected to the electrodes 11, 13, 31 and 33 of capacitors Cfly1 and Cfly2, and the selector switches SW11, SW12, SW21 and SW22 have their nodes cmd respectively connected to the nodes supplying the signals Cmd11, Cmd12, Cmd21 and Cmd22 from the control circuit 25.

In the example in FIG. 3, the control circuit 25 includes a first mode selection circuit 35, represented by an OR logic gate in the figure, including two input nodes i1 and i2 respectively linked to the node for applying the control signal D (i.e., the node that receives the control signal D) and to the node for applying the clock signal clk (i.e., the node that receives the clk signal), and an output node o linked to the control node cmd of the selector switch SW11. In addition, in this example, the control circuit 25 includes a second mode selection circuit 37, also represented by an OR logic gate in the figure, including two input nodes i1 and i2 respectively linked to the node for applying the control signal D and to a node for supplying a clock signal $\overline{clk}$, complementary to the clock signal clk (in other words a signal in phase opposition with the signal clk), and an output node o linked to the control node cmd of the selector switch SW21. The circuits 35 and 37 respectively supply the control signal Cmd11 for the selector switch SW11 and the control signal Cmd21 for the selector switch SW21. When the signal D is in the low state, the circuits 35 and 37 generate a substantially identical copy of the clock signal clk on the control node cmd of the selector switch SW11 and the complementary clock signal $\overline{clk}$ on the control node cmd of the selector switch SW21. When the signal D is in the high state, the circuits 35 and 37 copy the signal D onto the control nodes cmd for the selector switches SW11 and SW21, irrespective of the state of the clock signal clk, which leads to forcing each of the selector switches SW11 and SW21 to link its node n3 to its node n2.

In order to generate the complementary clock signal $\overline{clk}$, the circuit 25 in FIG. 3 includes an inverter 39 whose input is linked to the node for applying the clock signal clk and whose output is linked to the input node i2 of the mode selection circuit 37. In the example shown, the inverter 39 includes a P-channel MOS transistor 41 in series with an N-channel MOS transistor 43 between the node Vbat and the node Gnd. More particularly, the transistor 41 has its source connected to the node Vbat, its drain connected to the drain of the transistor 43, and the source of the transistor 43 is connected to the node Gnd. The node common to the drains of the transistors 41 and 43 forms the output of the inverter and is connected to the input node i2 of the circuit 37. The gates of the transistors 41 and 43 are connected to the same input node of the inverter, linked to the node for applying the clock signal clk. By way of example, the signal clk is a binary signal substantially equal to the potential of the node Vbat in the high state and substantially equal to the potential of the node Gnd in the low state. Thus, when the signal clk is in the high state, the transistor 41 is turned off and the transistor 43 is conducting, which results in the signal $\overline{clk}$ being in the low state, and, when the signal clk is in the low state, the transistor 41 is conducting and the transistor 43 is turned off, which results in the signal $\overline{clk}$ being in the high state.

The control circuit 25 in FIG. 3 additionally includes a circuit 45 for generating the control signals Cmd12 for the selector switch SW12 and Cmd22 for the selector switch SW22. It will indeed be noted that, given that the selector switches SW12 and SW22 are referenced to the negative potential of the node Vneg, their control signals must be offset by a voltage of the order of −Valim with respect to the control signals for the selector switches SW11 and SW21. In the example in FIG. 3, the circuit 45 supplies a control signal Cmd12 to the selector switch SW12 that is substantially identical to the clock signal clk, but shifted by a voltage of the order of −Valim with respect to the signal clk. In other words, when the signal clk is in the high state, i.e., substantially equal to the potential of the node Vbat, the signal Cmd12 is substantially equal to the potential of the node Gnd, and when the signal clk is in the low state, i.e., substantially equal to the potential of the node Gnd, the signal Cmd12 is substantially equal to −Valim. In addition, the circuit 45 supplies a control signal Cmd22 to the selector switch SW22 that is substantially identical to the complementary clock signal $\overline{clk}$ but offset by a voltage of the order of −Valim with respect to the signal $\overline{clk}$. In other words, when the signal $\overline{clk}$ is in the high state, i.e., substantially equal to the potential of the node Vbat, the signal Cmd22 is substantially equal to the potential of the node Gnd, and when the signal $\overline{clk}$ is in the low state, i.e., substantially equal to the potential of the node Gnd, the signal Cmd22 is substantially equal to −Valim.

In the example shown, the circuit 45 includes a capacitor C1 a first electrode of which is linked to the node for supplying the clock signal clk and the second electrode of which is linked to the control node cmd of the selector switch SW12, and a capacitor C2, for example substantially identical to the capacitor C1, a first electrode of which is linked to the node for supplying the complementary clock signal $\overline{clk}$ and a second electrode of which is linked to the control node cmd of the selector switch SW22. The circuit 45 furthermore includes two P-channel MOS transistors 47 and 49. The transistors 47 and 49 have their sources linked to the node GND. The transistor 47 has its drain linked to the control node cmd of the selector switch SW22 and its gate linked to the control node cmd of the selector switch SW12, and the transistor 49 has its drain linked to the control node cmd of the selector switch SW12 and its gate linked to the control node cmd of the selector switch SW22.

The operation of the circuit 45 is as follows. After a transient phase of a few cycles of the clock signal Clk, the capacitors C1 and C2 are charged up substantially to the voltage Valim. When the clock signal clk is in the low state, the capacitor C1 then imposes a potential substantially equal to −Valim on the control node cmd of the selector switch SW12. In addition, the transistor 47 is in the conducting state which results in a potential substantially equal to the potential of the node Gnd being applied to the control node cmd of the selector switch SW22. When the clock signal clk is in the high state, the complementary clock signal $\overline{clk}$ is in the low state, and the capacitor C2 then imposes a potential substantially equal to −Valim on the control node cmd of the selector switch SW22. Moreover, the transistor 49 is in the conducting state, which results in a potential substantially equal to the potential of the node Gnd being applied to the control node cmd of the selector switch SW12.

Particular embodiments have been described. Various variants and modifications will be apparent to those skilled in the art. In particular, the embodiments described are not limited to the particular exemplary embodiments of the selector switches and of the control circuit described in relation with FIG. 3.

It will furthermore be noted that the detailed implementation of the control circuit 25 described in relation with FIG. 3 may readily be adapted to a single-channel architecture of the type described in relation with FIG. 2, notably by removing the mode selection circuit 37.

Furthermore, those skilled in the art are able to modify the potential levels corresponding to the high and low states of the signals clk and D, and hence of Cmd11, Cmd12, Cmd21 and Cmd22, by adapting the way in which the selector switches and/or the control circuits for these selector switches are implemented. For example, in the case where it is desired that the circuits in FIGS. 2 and 3 operate in charging mode when the signal D is in the high state and in discharging mode when the signal D is in the low state, the circuits 35 and 37 may be replaced by NAND gates.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A negative charge pump circuit, comprising:
   a first capacitor including first and second electrodes;
   a first selector switch configured to link the first electrode of the first capacitor either to a first node configured to receive a positive power supply potential or to a second node configured to receive a reference potential;
   a second selector switch configured to link the second electrode of the first capacitor either to the second node or to a third node for supplying a negative power supply potential; and
   a control circuit including:
      a node configured to receive a clock signal and a node configured to receive an operating mode selection signal, the clock signal defining the switching frequency of the first and second selector switches in the first phase of operation and the switching frequency of the second selector switch in the second phase of operation, and the operating mode selection signal defining the duration of the first and second phase of operation;
      a first operating mode selection circuit configured to apply a control signal to the first selector switch that is substantially identical to the clock signal in response to the operating mode selection signal being in a first state, and the first operating mode selection circuit configured to apply a fixed control signal forcing the first selector switch to link the first electrode of the first capacitor to the second node in response to the operating mode selection signal being in a second state; and
      wherein the control circuit is configured to:
         in a first phase of operation, alternately control the first and second selector switches in a first configuration in which the first and second electrodes of the first capacitor are respectively linked to the first and second nodes, and in a second configuration in which the first and second electrodes of the first capacitor are respectively linked to the second and third nodes; and
         in a second phase of operation, force the first selector switch to link the first electrode of the first capacitor to the second node and to control the second selector switch to alternately link the second electrode of the first capacitor to the second and third nodes to discharge the third node.

2. The negative charge pump circuit according to claim 1, wherein the control circuit is configured to alternately repeat the first and second phases of operation in a periodic fashion to generate the negative power supply potential on the third node at a negative value in a range between the reference potential and opposite negative value having a magnitude equal to a magnitude of the positive power supply potential.

3. The negative charge pump circuit according to claim 1, furthermore comprising:
   a second capacitor having first and second electrodes;
   a third selector switch configured to link the first electrode of the second capacitor either to the first node or to the second node; and
   a fourth selector switch configured to link the second electrode of the second capacitor either to the second node or to the third node,
   wherein the control circuit is further configured to:
      in the first phase of operation, control the third and fourth selector switches in phase opposition with the first and second selector switches to link the first and second electrodes of the second capacitor, respectively, to the second and third nodes when the first and second electrodes of the first capacitor are respectively linked to the first and second nodes, and to link the first and second electrodes of the second capacitor, respectively, to the first and second nodes when the first and second electrodes of the first capacitor are respectively linked to the second and third nodes; and
      in the second phase of operation, force the third selector switch to link the first electrode of the second capacitor to the second node and control the fourth selector switch in phase opposition with the second selector switch to alternately link the second electrode of the second capacitor to the third node when the second electrode of the first capacitor is linked to the second node and to the second node when the second electrode of the first capacitor is linked to the third node.

4. The negative charge pump circuit according to claim 1, wherein each selector switch comprises a first P-channel MOS transistor coupled in series with a second N-channel MOS transistor, the drains of the first and second transistors being common and the gates of the first and second transistors being common, the source of the first transistor defining a first conduction node of the selector switch, the source of the second transistor defining a second conduction node of the selector switch, the drains of the first and second transistors defining a third conduction node of the selector switch, and the gates of the first and second transistors defining a control node of the selector switch.

5. The negative charge pump circuit according to claim 1, wherein the control circuit is configured to apply a control signal to the second selector switch that is substantially identical to the clock signal but shifted in voltage by a negative value having a magnitude substantially equal a magnitude of the positive power supply potential irrespective of the state of the operating mode selection signal.

6. The negative charge pump circuit according to either of claim 5, wherein the control circuit comprises a second operating mode selection circuit configured to apply a control signal to the third selector switch that is complementary to the clock signal in response to the operating mode selection signal being in the first state, and configured to apply a fixed control signal to force the third selector switch to link the first electrode of the second capacitor to the second node in response to the operating mode selection signal being in the second state.

7. The negative charge pump circuit according to claim 6, wherein the control circuit is configured to apply a control signal to the fourth selector switch that is substantially identical to the complementary clock signal but shifted in voltage by a negative value substantially equal to a magnitude of the positive power supply potential irrespective of the state of the operating mode selection signal.

8. A method for controlling a negative charge pump circuit circuit, comprising:
   coupling a first electrode of a first capacitor alternately to a first node configured to receive a positive power supply potential and to a second node configured to receive a reference potential;
   coupling a second electrode of the first capacitor alternately to the second node and to a third node configured to provide a negative power supply potential;
   in a first phase of operation, alternately coupling the first and second electrodes of the first capacitor to the first and second nodes, respectively, and coupling the first and second electrodes of the first capacitor to the second and third nodes, respectively;
   in a second phase of operation, coupling the first electrode of the first capacitor to the second node and alternately coupling the second electrode of the first capacitor to the second and to the third node to thereby discharge the third node and decrease an absolute value of the negative power supply potential;
   coupling a first electrode of a second capacitor alternately to the first and second node;
   coupling the second electrode of the second capacitor alternately to the second node and third nodes;
   in the first phase of operation, coupling of the first and second electrodes of the second capacitor, respectively, to the second and third nodes when the first and second electrodes of the first capacitor are respectively coupled to the first and second nodes, the coupling of the first and second electrodes of the second capacitor being in phase opposition with the coupling of the first and second electrodes of the first capacitor, and coupling the first and second electrodes of the second capacitor, respectively, to the first and second nodes when the first and second electrodes of the first capacitor are respectively coupled to the second and third nodes; and
   in the second phase of operation, coupling the first electrode of the second capacitor to the second node and alternately coupling, in phase opposition with the coupling of the second electrode of the first capacitor, the second electrode of the second capacitor to the third node when the second electrode of the first capacitor is coupled to the second node and to the second node when the second electrode of the first capacitor is coupled to the third node.

9. The method of claim 8 further comprising alternately repeating the first and second phases of operation.

10. The method of claim 8, wherein each of the operations of coupling comprises coupling the corresponding nodes through a MOS transistor.

11. The method of claim 8 further comprising receiving a clock signal that defines a switching frequency of the coupling of the first and second electrodes of the first capacitor in the first phase of operation and defines a switching frequency of the second electrode in the second phase of operation.

12. The method of claim 11 further comprising receiving an operating mode selection signal that defines durations of the first and second phases of operation.

13. The method of claim 12 further comprising generating a complementary clock signal based on the clock signal and controlling coupling of the first and second electrodes of the second capacitor based on the complementary clock signal.

14. The method of claim 8, wherein the negative power supply potential has a magnitude that is substantially equal to a magnitude of the positive power supply potential.

15. A negative charge pump circuit comprising:

switching circuitry configured to control coupling of first and second electrodes of a first capacitor to a positive power supply potential, a reference potential, or a negative power supply potential, the switching circuitry configured in a first phase of operation to alternately control coupling of the first and second electrodes of the first capacitor to the positive power supply potential and the reference potential, and in a second configuration to couple the first and second electrodes of the first capacitor to the reference potential and negative power supply potential, respectively, and the switching circuitry further configured in a second phase of operation to couple the first electrode of the first capacitor to the reference potential and to alternately couple the second electrode of the first capacitor to the reference potential and the negative power supply potential to decrease an absolute value of the negative power supply potential;

a node configured to receive a clock signal and a node configured to receive an operating mode selection signal, the clock signal defining a switching frequency in the first phase of operation and the switching frequency in the second phase of operation; and a node configured to receive an operating mode selection signal defining the duration of the first and second phases of operation; and a first operating mode selection circuit configured to provide a control signal in the first phase of operation that is substantially identical to the clock signal in response to the operating mode selection signal being in a first state, and configured to provide a fixed control signal that causes the switching circuitry to couple the first electrode of the first capacitor to the second node in response to the operating mode selection signal being in a second state.

16. The negative charge pump circuit of claim 15, wherein the switching circuitry comprises MOS transistors.

17. The negative charge pump circuit of claim 15 further comprising a second capacitor including first and second electrodes, wherein the switching circuitry is further configured to control coupling of the positive power supply potential and reference potential to the first electrode of the second capacitor and to control coupling of the negative power supply potential and the reference potential to the second electrode of the second capacitor.

* * * * *